(12) United States Patent
Ervin et al.

(10) Patent No.: US 9,059,248 B2
(45) Date of Patent: Jun. 16, 2015

(54) JUNCTION BUTTING ON SOI BY RAISED EPITAXIAL STRUCTURE AND METHOD

(75) Inventors: Joseph Ervin, Wappingers Falls, NY (US); Kangguo Cheng, Guilderland, NY (US); Chengwen Pei, Danbury, CT (US); Geng Wang, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 672 days.

(21) Appl. No.: 13/369,382

(22) Filed: Feb. 9, 2012

(65) Prior Publication Data

US 2013/0207188 A1  Aug. 15, 2013

(51) Int. Cl.
| | |
|---|---|
| *H01L 21/336* | (2006.01) |
| *H01L 21/8234* | (2006.01) |
| *H01L 21/762* | (2006.01) |
| *H01L 21/84* | (2006.01) |
| *H01L 27/12* | (2006.01) |

(52) U.S. Cl.
CPC .......... *H01L 21/76283* (2013.01); *H01L 21/84* (2013.01); *H01L 27/1203* (2013.01)

(58) Field of Classification Search
CPC ............. H01L 21/76264; H01L 21/76283; H01L 21/84; H01L 27/1203; H01L 29/66772
See application file for complete search history.

(56) References Cited

U.S. PATENT DOCUMENTS

| | | |
|---|---|---|
| 6,303,450 B1 | 10/2001 | Park et al. |
| 7,037,795 B1 | 5/2006 | Barr et al. |
| 7,339,235 B1 | 3/2008 | Yamazaki et al. |
| 7,368,358 B2 | 5/2008 | Ouyang et al. |
| 7,494,856 B2 * | 2/2009 | Zhang et al. ................. 438/197 |
| 7,704,839 B2 * | 4/2010 | Ieong et al. ................. 438/283 |
| 7,960,229 B2 | 6/2011 | Yang et al. |
| 8,946,064 B2 * | 2/2015 | Adam et al. ................. 438/481 |
| 2006/0030093 A1 * | 2/2006 | Zhang et al. ................. 438/197 |
| 2008/0132049 A1 * | 6/2008 | Kim et al. ................. 438/583 |
| 2009/0200604 A1 * | 8/2009 | Chidambarrao et al. ..... 257/329 |
| 2011/0073961 A1 | 3/2011 | Dennard et al. |

FOREIGN PATENT DOCUMENTS

KR     20060122527 A     11/2006

OTHER PUBLICATIONS

Chaudhry, A. et al., "Controlling Short-channel Effects in Deep Submicron SOI MOSFETs for Improved Reliability: A Review", IEEE Trans. on Device and Materials Reliability, Mar. 2004, pp. 99-109, vol. 4.

(Continued)

*Primary Examiner* — Zandra Smith
*Assistant Examiner* — John M Parker
(74) *Attorney, Agent, or Firm* — Scully, Scott, Murphy & Presser, P.C.; H. Daniel Schnurmann (57) ABSTRACT

A method of forming a semiconductor device including forming well trenches on opposing sides of a gate structure by removing portions of a semiconductor on insulator (SOI) layer of an semiconductor on insulator (SOI) substrate, wherein the base of the well trenches is provided by a surface of a buried dielectric layer of the SOI substrate and sidewalls of the well trenches are provided by a remaining portion of the SOI layer. Forming a dielectric fill material at the base of the well trenches, wherein the dielectric fill material is in contact with the sidewalls of the well trenches and at least a portion of the surface of the buried dielectric layer that provides the base of the well trenches. Forming a source region and a drain region in the well trenches with an in-situ doped epitaxial semiconductor material.

13 Claims, 5 Drawing Sheets

(56) References Cited

OTHER PUBLICATIONS

Ranka, D., et al., "Performance Analysis of FS-SOI MOSFET with Different Gate Spacer Dielectric", International Journal of Computer Applications (0975-8887), Mar. 2011, vol. 18, No. 5.

Lammers, D., News Editor, "CMOS Transitions to 22 and 15 nm", Semiconductor International, Jan. 2010, vol. 33, No. 1, pp. 12-16.

U.S. Appl. No. 13/161,913, entitled, "Transistor With Buried Silicon Germanium for Improved Proximity Control and Optimized Recess Shape", filed Jun. 16, 2011, First Named Inventor: Thomas N. Adam.

\* cited by examiner

JUNCTION BUTTING ON SOI BY RAISED EPITAXIAL STRUCTURE AND METHOD

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

In one embodiment, a method of forming a semiconductor device is provided that includes forming well trenches on opposing sides of a gate structure by removing portions of a semiconductor on insulator (SOI) layer of an semiconductor on insulator (SOI) substrate. The base of the well trenches is provided by a surface of a buried dielectric layer of the SOI substrate and sidewalls of the well trenches are provided by a remaining portion of the SOI layer. A dielectric fill material is formed at the base of the well trenches. The dielectric fill material is in contact with the sidewalls of the well trenches and at least a portion of the surface of the buried dielectric layer that provides the base of the well trenches. A source region and a drain region are formed in the well trenches with an in-situ doped epitaxial semiconductor material.

In another aspect, a semiconductor device is provided that may include a semiconductor on insulator (SOI) substrate including a semiconductor on insulator (SOI) layer that is present on a buried dielectric layer. A functional gate structure is present on a channel portion of the SOI layer. Well regions composed of an epitaxial semiconductor material are present in direct contact with opposing sides of the channel portion of the SOI layer. The well regions provide a source region and a drain region of the semiconductor device. A well region spacer may be positioned between the buried dielectric layer, the channel portion of the SOI layer and the epitaxial semiconductor material. The well region spacer has a base surface in direct contact with a surface of the buried dielectric layer and a sidewall surface that is in direct contact with a sidewall of the channel portion of the SOI layer.

In another embodiment, the semiconductor device may include a semiconductor on insulator (SOI) substrate including a semiconductor on insulator (SOI) layer that is present on a buried dielectric layer. A functional gate structure may be present on a channel portion of the SOI layer. Well regions composed of an epitaxial semiconductor material may be in direct contact with opposing sides of the channel portion of SOI layer, and may have a same crystal structure as the channel portion of the SOI layer. A dielectric filler may be present between the well region of the epitaxial semiconductor material and the buried dielectric layer.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper" and "lower", and derivatives thereof, shall relate to the disclosed structures, as they are oriented in the drawing figures. The term "direct contact" means that a first element, such as a first structure, and a second element, such as a second structure, are connected without any intermediary conducting, insulating or semiconductor layers at the interface of the two elements. The terms "overlying", "underlying" or "positioned on" means that a first element, such as a first structure, is present on a second element, such as a second structure, wherein intervening elements, such as an interface structure, e.g., interface layer, may be present between the first element and the second element.

In some electrical structures including multiple semiconductor devices on a single island of semiconductor material, the doped regions that provide the source and drain regions for the semiconductor devices may provide isolation between the adjacent semiconductor devices. As used herein, the term "semiconductor device" refers to an intrinsic semiconductor material that has been doped, i.e., into which a doping agent has been introduced, giving it different electrical properties than the intrinsic semiconductor. Although the following description refers to field effect transistors (FETs), the present disclosure is not limited to only this type of semiconductor device, as any semiconductor device including doped regions, such as source and drain regions, that may be incorporated with other semiconductor devices on a single semiconductor substrate is within the scope of the present application. As used herein, the term "source" is a doped region in the semiconductor device, in which majority carriers are flowing into the channel of the semiconductor device. As used herein, the term "drain" means a doped region in semiconductor device located at the end of the channel, in which carriers are flowing out of the semiconductor device through the drain. Typically, to provide isolation between adjacent semiconductor devices using the source and drain regions, the dopant that provides the source and drain regions is implanted to extend to a depth at which a dielectric layer is present, such as the buried dielectric layer of a semiconductor on insulator (SOI) substrate. It has been determined that doping the source and drain regions to these depths with ion implantation can result in lateral dopant straggle towards or into the device channel, which can result in short channel effects and retro doping of the channel, as well as increasing leakage to the body of the device.

Figure 1:
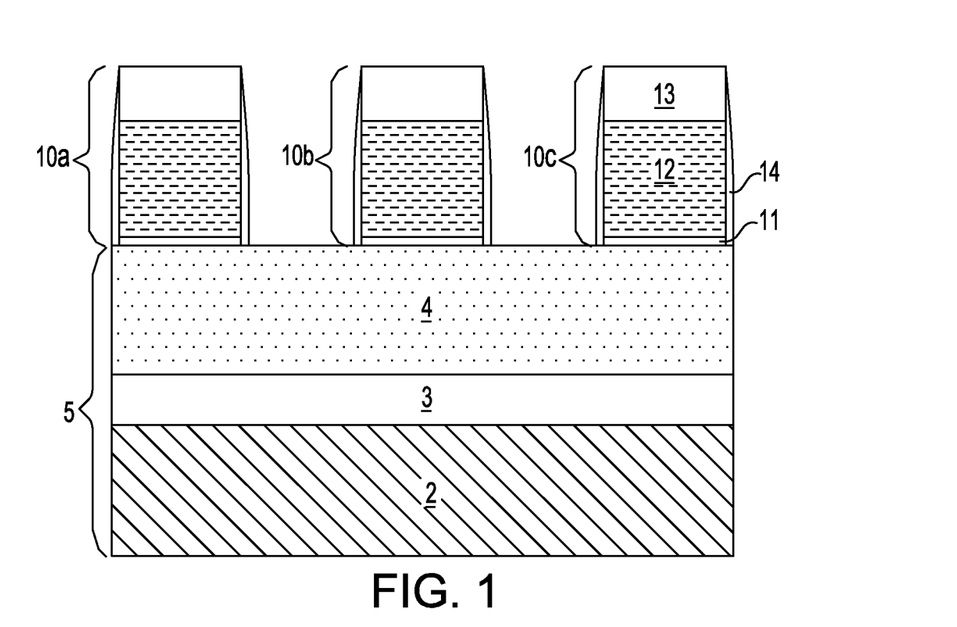
FIG. 1 is a side cross-sectional view depicting forming a gate structure on a semiconductor on insulator (SOI) substrate, wherein the (SOI) substrate includes a semiconductor on insulator (SOI) layer on a buried dielectric layer, in accordance with the present disclosure.

In some embodiments, the methods and structures disclosed herein substitute an epitaxial growth process incorporating in-situ dopant to replace ion implantation as the means for forming the source and drain regions. Further, a dielectric material may be formed on the buried dielectric layer of the SOI substrate underlying the epitaxial in-situ doped source and drain regions. The details of this process, and resultant structures, are now described with reference to FIGS. 1-7B. FIG. 1 illustrates the results of the processing steps that produce gate structures 10a, 10b, 10c on a semiconductor on insulator (SOI) substrate 5. The SOI substrate 5 includes a semiconductor on insulator (SOI) layer 4 on a buried dielectric layer 3, wherein the buried dielectric layer 3 may be present on a base semiconductor layer 2. In the process flow that is depicted in FIGS. 1-7B, the gate structures 10a, 10b, 10c are replacement gate structures, in which the replacement gate structure is replaced during the process flow with a functional gate structure after the in-situ doped epitaxial semiconductor material is formed that provides the source and drain regions of the semiconductor device. This process flow may be referred to as a "gate last process". Although not depicted in the figures, the methods and structures disclosed herein are equally applicable to a gate first process, in which a functional gate structure is formed prior to the in-situ doped epitaxial semiconductor material, and remains in the final structure of the semiconductor device. For the purposes of clarity, the gate structures 10a, 10b, 10c will hereafter be referred to as replacement gate structure 10a, 10b, 10c. Further, in some embodiments, a gate last process may be practiced in which a sacrificial gate conductor is formed on a functional gate dielectric, wherein the functional gate dielectric remains in the structure while the sacrificial gate conductor is replaced with a functional gate structure. Referring to FIG. 1, the SOI layer 4 may include any semiconducting material including, but not limited to, Si, strained Si, SiC, SiGe, SiGeC, Si alloys, Ge, Ge alloys, GaAs, InAs, and InP, or any combination thereof. In one embodiment, the SOI layer 4 has a thickness ranging from 1.0 nm to 10.0 nm. In another embodiment, the SOI layer 4 has a thickness ranging from 1.0 nm to 5.0 nm. In a further embodiment, the SOI layer 4 has a thickness ranging from 3.0 nm to 8.0 nm. The base semiconductor layer 2 may be a semiconducting material including, but not limited to; Si, strained Si, SiC, SiGe, SiGeC, Si alloys, Ge, Ge alloys, GaAs, InAs, InP as well as other III/V and II/VI compound semiconductors. The buried dielectric layer 3 that is present underlying the SOI layer 4 and atop the base semiconductor layer 2 may be formed by implanting a high-energy dopant into the substrate and then annealing the structure to form a buried oxide layer, i.e., buried dielectric layer 3. In another embodiment, the buried dielectric layer 3 may be deposited or grown prior to the formation of the SOI layer 4. In yet another embodiment, the SOI substrate 5 may be formed using wafer-bonding techniques, where a bonded wafer pair is formed utilizing glue, adhesive polymer, or direct bonding.

The replacement gate structures 10a, 10b, 10c are formed on the channel portions of the SOI layer 4. As used herein, the term "replacement gate structure" denotes a sacrificial structure that dictates the geometry and location of the later formed functional gate structure. The number of replacement gate structures 10a, 10b, 10c are selected to provide the number of functional gate structures corresponding to the number of semiconductor devices that are formed on the single continuous piece of semiconductor material that each of the semiconductor devices share. Although FIG. 1 depicts three replacement gate structures, the present disclosure is not limited to only this example, because any number of replacement gate structures 10a, 10b, 10c may be present on the SOI substrate 5.

The replacement gates structures 10a, 10b, 10c may be formed atop the SOI substrate 5 utilizing deposition and lithography processes. In one embodiment, a replacement gate structure 10a, 10b, 10c is provided atop the semiconductor substrate 5 by depositing a sacrificial gate dielectric layer followed by a sacrificial gate electrode layer. In a following process step, the gate stack that is composed of the sacrificial gate dielectric layer and the sacrificial gate electrode layer is patterned using photolithography and etch processes. For example, following the deposition of the sacrificial gate dielectric layer and sacrificial gate electrode layer, an etch mask is formed atop the dummy gate electrode layer protecting the portion of the gate stack that provides the replacement gate structures 10a, 10b, 10c, wherein the portions exposed by the etch mask are removed by an anisotropic etch process, such as a reactive ion etch. In one embodiment, the etch mask may be provided by a patterned photoresist layer. The remaining portion of the sacrificial gate dielectric layer and the sacrificial gate electrode layer provide the sacrificial gate dielectric 11 and the sacrificial gate electrode 12 of the replacement gate structures 10a, 10b, 10c. Each of the replacement gate structures 10a, 10b, 10c may have a width W1 ranging from 1 nm to 100000 nm. More typically, the width W1 for each of the replacement gate structures 10a, 10b, 10c ranges from 10 nm to 10000 nm.

Figure 6:
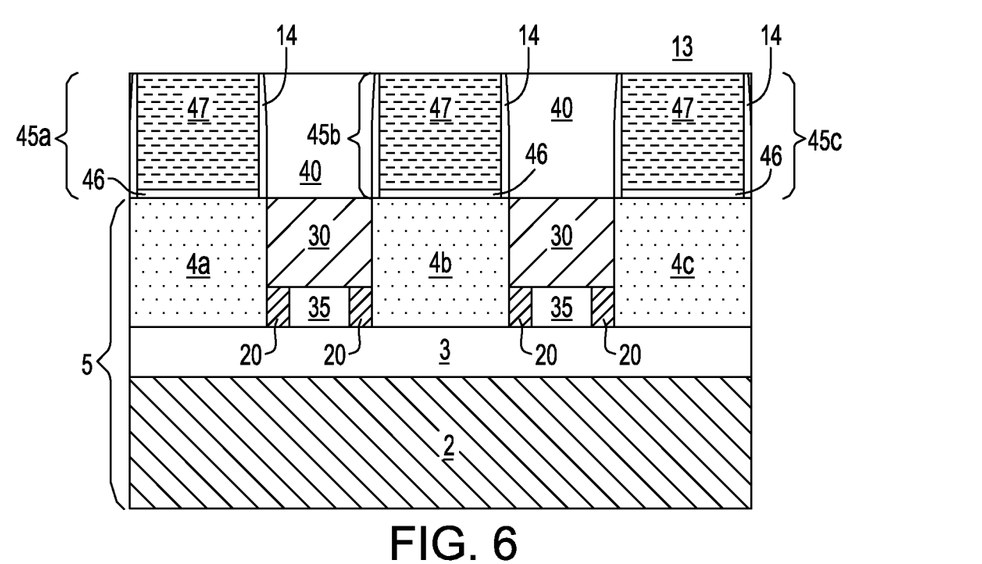
FIG. 6 is a side cross-sectional view depicting one embodiment, in which the gate structure is a replacement gate structure that is substituted with a functional gate structure, in accordance with one embodiment of the present disclosure.

In the embodiments of the present disclosure that employ a gate first process sequence, the above procedures for forming the replacement gate structures 10a, 10b, 10c of a gate last process sequence are equally applicable for forming the gate structure in a gate first process sequence, in which the gate structure being formed is a functional gate structure. One difference between a gate last process and a gate first process is that in the gate last process the materials of the replacement gate structures 10a, 10b, 10c at this stage of the process sequence are sacrificial, and may be selected for etch selectivity when substituting the replacement gate structures 10a, 10b, 10c with the later formed functional gate structure, whereas in a gate first process the materials of the gate stacks are selected for their functionality in the final semiconductor device structure. Materials suitable for the gate structures of the gate first process are described below when describing the functional gate structure that is depicted in FIG. 6.

Referring to FIG. 1, the sacrificial gate dielectric 11 of the replacement gate structures 10a, 10b, 10c may be composed of any dielectric material, such as an oxide material. The sacrificial gate dielectric 11 may also be composed of a nitride, oxynitride, or a combination (or multi layer) of oxide, nitride and oxynitride. In one embodiment, the sacrificial gate dielectric 11 has a thickness greater than approximately 0.8 nm. More typically, the sacrificial gate dielectric 11 has a thickness ranging from about 1.0 nm to about 6.0 nm. It is noted that other materials and thicknesses are contemplated for the sacrificial gate dielectric 11, and are within the scope of the present disclosure, so long as the composition and thickness of the sacrificial gate dielectric 11 provide for etch selectivity in the removal of the replacement gate structure 10a, 10b, 10c. The sacrificial gate dielectric 11 may be formed using chemical vapor deposition (CVD) including, but not limited to, atomic layer CVD (ALCVD), pulsed CVD, plasma assisted CVD. In another embodiment, the sacrificial gate dielectric 11 is formed by a thermal growing process.

The sacrificial gate electrode 12 of the replacement gate structures 10a, 10b, 10c may be composed of a silicon containing material, which may be polysilicon. In another embodiment, the sacrificial gate electrode 12 is composed of single crystal Si, SiGe, SiGeC or combinations thereof. In another embodiment, the sacrificial gate electrode 12 may be a metal. In one embodiment, the sacrificial gate electrode 12 is formed atop the sacrificial gate dielectric 11 utilizing a deposition process, such as CVD and/or physical vapor deposition (PVD). Similar to the sacrificial gate dielectric 11, other materials and thicknesses are contemplated for the sacrificial gate electrode 12, and are within the scope of the present disclosure, so long as the composition and thickness of the sacrificial gate electrode 12 provides for etch selectivity in the removal of the replacement gate structures 10a, 10b, 10c.

The replacement gate structures 10a, 10b, 10c may further include a sacrificial gate cap 13 that is overlying the sacrificial gate electrode 12. The sacrificial gate cap 13 may be a dielectric layer composed of a nitride, such as silicon nitride. The sacrificial gate cap 13 is optional, and may be omitted from the replacement gate structures 10a, 10b, 10c. A gate cap that is similar in structure and composition to the sacrificial gate cap 13 that is employed in the replacement gate/gate last process flow depicted in FIGS. 1-7B may also be formed atop the gate structure in the embodiments of the present disclosure that provide a gate first process. The gate cap is optional in the gate first process sequence, and may be omitted.

At least one gate sidewall spacer 14 may then be formed adjacent to each of the replacement gate structures 10a, 10b, 10c, e.g., in direct contact with the sidewall of the replacement gate structures 10a, 10b, 10c. In one embodiment, the at last one gate sidewall spacer 14 may be formed by using a blanket layer deposition, such as chemical vapor deposition, and an anisotropic etchback method. The at least one gate sidewall spacer 14 may have a width, as measured from its base, ranging from 2.0 nm to 15.0 nm, and may be composed of a dielectric, such as a nitride, oxide, oxynitride, or a combination thereof. The gate sidewall spacer 14 is optional, and may be omitted. Gate sidewall spacers that is similar in structure and composition to the gate sidewall spacers that are employed in the replacement gate/gate last process flow depicted in FIGS. 1-7B may also be formed adjacent to the gate structure in the embodiments of the present disclosure that provide a gate first process. The gate sidewall spacers are optional in the gate first process sequence, and may be omitted.

Figure 2:
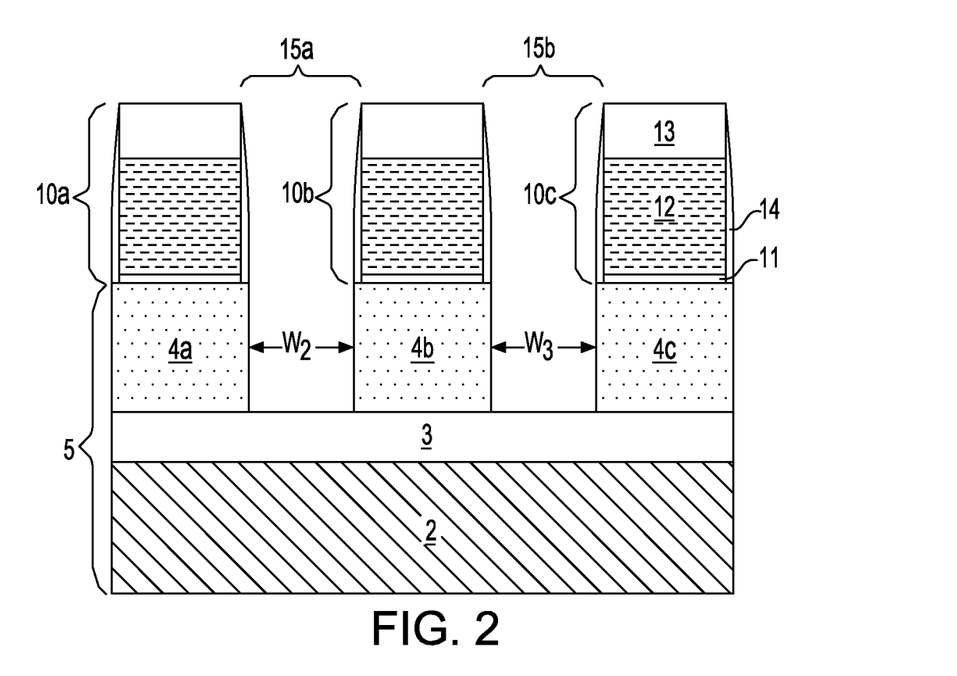
FIG. 2 is a side cross-sectional view depicting forming well trenches on opposing sides of the gate structure by removing portions of the SOI layer, in accordance with the present disclosure.

FIG. 2 depicts one embodiment of forming well trenches 15a, 15b in the SOI substrate 5 on opposing sides of the replacement gate structures 10a, 10b, 10c by removing exposed portions of the SOI layer. A well trench 15a, 15b may be positioned on each side of the replacement gate structure 10a, 10b, 10c (FIG. 3 only depicts the two well trenches 15a, 15b for the first replacement gate structure 10b), and provides the site for the subsequently formed source and drain regions. In one embodiment, the well trenches 15a, 15b may be formed using an anisotropic etch process. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. In one embodiment, the anisotropic etch process is continued until the upper surface of the buried dielectric layer 3 is exposed. The anisotropic etch process may be terminated using end point detection.

In one embodiment, the anisotropic etch process may employ a selective etch chemistry. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In one embodiment, the etch chemistry of the anisotropic etch is selected to remove the SOI layer 4 selective to the buried dielectric layer 3. The etch chemistry of the anisotropic etch may also be selective to the sacrificial dielectric cap 13 and the at least one gate sidewall spacer 14 of the replacement gate structures 10a, 10b, 10c.

Following formation of the well trenches 15a, 15b, a remaining portion of the SOI layer 4a, 4b, 4c is present underlying each of the replacement gate structures 10a, 10b, 10c, and will provide the site for the channel of the semiconductor devices corresponding to the replacement gate structures 10a, 10b, 10c. In the embodiments, in which the etch process that forms the well trenches 15a, 15b is selective to the gate sidewall spacers 14, the sidewalls for the remaining portions of the SOI layer 4a, 4b, 4c that are underlying the replacement gate structures 10a, 10b, 10c may be aligned to the outermost sidewall surface of the gate sidewall spacer 14.

Referring to FIG. 2, in one embodiment, the well trenches 15a, 15b have a first width W2 that extends from a first portion of the remaining SOI layer 4b that is directly under a first replacement gate structure 10b to a second remaining portion of the SOI layer 4a that is directly under an adjacent second replacement gate structure 10a that is on one side of the first replacement gate structure 10b, and the well trenches 15a, 15b have a second width W3 that extends from the first portion of the remaining SOI layer 4b that is directly under the first replacement gate structure 10b to a third portion of the remaining SOI layer 4c that is directly under a third replacement gate structure 10c. The width W2, W3 of the well trenches 15a, 15b may range from 10 nm to 100000 nm. In another embodiment, the width W2, W3 of the well trenches 15a, 15b may range from 30 nm to 500 nm.

Each replacement gate structure 10a, 10b, 10c, may include two well trenches 15a, 15b, which provide the site for the subsequently formed source and drain regions. In one embodiment, because each replacement gate structure 10a, 10b, 10c includes two well trenches 15a, 15b, and one well trench 15a, 15b is shared between adjacent replacement gate structures 10a, 10b, 10c, the total number of well trenches 15a, 15b on the SOI substrate 5 is equal to the total number of replacement gate structures 10a, 10b, 10c plus one. For example, on an SOI substrate 5 that includes three replacement gate structures 10a, 10b, 10c, the total number of well trenches 15a, 15b for the subsequently formed source and drain regions would be equal to four. This would provide a source and drain region for each of the three semiconductor devices having a functional gate structure substituted for each of the three replacement gate structures 10a, 10b, 10c.

Figure 3A:
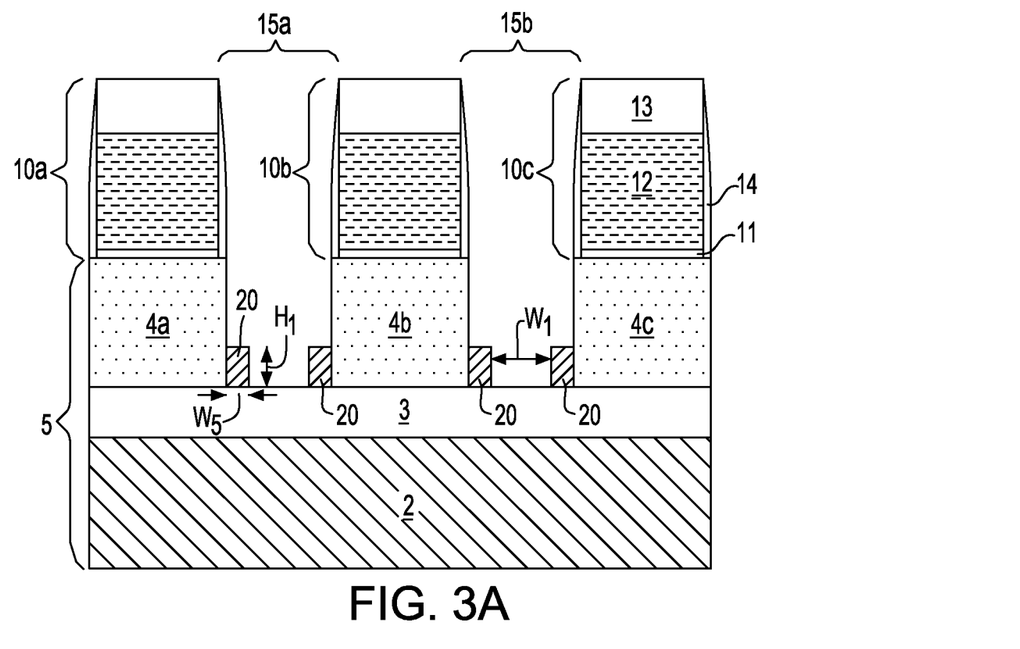
FIG. 3A is a side cross-sectional view depicting forming a well region spacer at the base of the well trenches depicted in FIG. 2, in accordance with one embodiment of the present disclosure.
Figure 3B:
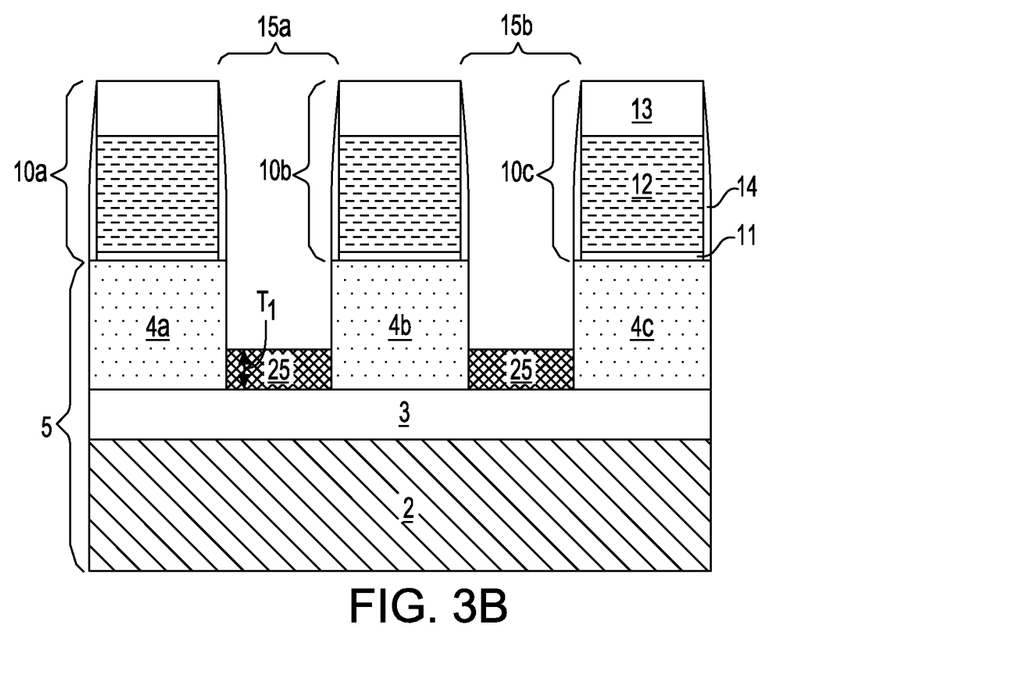
FIG. 3B is a side cross-sectional view depicting forming a dielectric fill at the base of the well trenches that are depicted in FIG. 2, in accordance with one embodiment of the present disclosure.

FIGS. 3A and 3B depicting forming a dielectric fill material at the base of the trench wells 15a, 15b that is in contact with the sidewalls of the remaining portions of the SOI layer 4a, 4b, 4c, and at least a portion of the surface of the buried dielectric layer 3 that provides the base of the trench wells 15a, 15b. FIG. 3A depicts one embodiment of the present disclosure, in which the dielectric fill material is deposited and etched to provide a well region spacer 20, wherein the dielectric fill material has been removed from a central portion of the surface of the buried dielectric layer 3 that provides the base of the well trenches 15a, 15b.

The dielectric fill material that provides the well region spacer 20 may be composed of any dielectric material, such as oxides, nitrides or oxynitride materials. Suitable examples of dielectric fill material that can be employed in the well region spacer 20 include, but are not limited to, $SiO_2$, SiN, SiON, $TiO_2$, $La_2O_3$, $SrTiO_3$, $LaAlO_3$, $ZrO_2$, $Y_2O_3$, $Gd_2O_3$, MgO, MgNO, $Al_2O_3$, AN, AlON, $Ta_2O_3$, $TiO_2$, Hf-based dielectrics, perovskite-type oxides and combinations and multilayers thereof. Examples of Hf-based dielectrics that are suitable for the well region spacer 20 include hafnium oxide ($HfO_2$), hafnium silicate ($HfSiO_x$), Hf silicon oxynitride (HfSiON) or multilayers thereof.

In one embodiment, the well region spacers 20 may be formed by depositing the dielectric fill material within the well trenches 15a, 15b, and etching the dielectric fill material to expose a portion of the buried dielectric layer 3 centrally positioned within the well trenches 15a, 15b, wherein the remaining portion of the dielectric fill material provides the well region spacers 20. The exposed portion of the buried dielectric layer 4 at the base of the well trenches 15a, 15b may range from 1 nm to 25000 nm. In another embodiment, the exposed portion of the buried dielectric layer 4 at the base of the well trenches 15a, 15b may range from 20 nm to 200 nm. The remaining portion of the dielectric fill material that provides the well region spacers 20 may be present at the base of the well trenches 15 in direct contact with the upper surface of the buried dielectric layer 3, and may be present in direct contact with a sidewall surface of the remaining portions of the SOI layer 4a, 4b, 4c. In one embodiment, the well region spacers 20 are in direct contact with the lower half of the sidewall surface of the remaining portions of the SOI layer 4a, 4b, 4c or less. In another embodiment, the well region spacers 20 are in direct contact with a lower contact of the sidewall surface of the remaining portions of the SOI layer 4a, 4b, 4c. In one embodiment, the height H1 of the well region spacers 20 ranges from 1 nm to 200 nm. In another embodiment, the height H1 of the well regions spacer 20 ranges from 5 nm to 60 nm. In one embodiment, the width W4 of the well region spacers 20 may range from 1 nm to 25000 nm. In another embodiment, the width W4 of the well region spacers 20 may range from 20 nm to 200 nm.

The dielectric fill material that provides the well region spacers 20 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the dielectric fill material that provides the well region spacers 20 may be deposited using spinning from solution, spraying from solution, and evaporation. In one embodiment, the dielectric fill material is deposited within the well trenches 15a, 15b using a conformal deposition process, such as plasma enhanced chemical vapor deposition, so that a portion of the dielectric fill material is present on the sidewalls and base of the well trenches 15a, 15b. The term "conformal layer" denotes a layer having a thickness that does not deviate from greater than or less than 20% of an average value for the thickness of the layer.

The etch process that removes the portion of the dielectric fill material that is present in the center of the well trenches 15a, 15b may be an etch that is selective to the buried dielectric layer 3 of the SOI substrate 5. The etch process that removes the portion of the dielectric fill material that is present at the center of the well trenches 15a, 15b may also be selective to the sacrificial dielectric cap 13 and the gate sidewall spacer 14. In some embodiments, an etch mask may be formed over the portion of the dielectric fill material that provides the well region spacers 20 so that it is not removed by the etch that removes the portion of the dielectric fill material that is present in the center of the well trenches 15a, 15b. The etch mask may be composed of photoresist, and may be patterned using photolithography. In some embodiments, the etch process for removing the portions of the dielectric fill material that are not protected by the etch mask is an anisotropic etch, such as reactive ion etch, ion beam etching, or laser ablation.

In one embodiment, in which the dielectric fill material is deposited within the well trenches 15a, 15b using a conformal deposition process so that a portion of the dielectric fill material is present on the sidewalls and base of the well trenches 15a, 15b, the etch process for removing the central portion of the dielectric fill material may be an anisotropic etch. In this embodiment, the height of the dielectric fill material that is present on the sidewalls of the well trench 15a, 15b, as measured from the upper surface of the buried dielectric layer 3, is greater than the height of the dielectric fill material (also measured from the upper surface of the buried dielectric layer 3) that is present centrally within the well trenches 15a, 15b. Because of the difference in height of the dielectric fill material between the portions of the dielectric fill material that are in direct contact with the sidewalls of the well trenches 15a, 15b, and the portion of the dielectric fill material that is centrally positioned within the well trenches 15a, 15b, an anisotropic etch, such as reactive ion etch, may remove the central portion of the dielectric fill material in it's entirety while only recessing the dielectric fill material that is present on the sidewalls of the well trenches 15a, 15b. In this embodiment, the recessed dielectric fill material that is remains on the sidewalls of the well trenches 15a, 15b provides the well region spacers 20.

FIG. 3B depicts another embodiment of the present disclosure, in which the dielectric fill material that is formed in the well trenches 15a, 15b is present in direct contact with the entire surface of the buried dielectric layer 3 that provides the base of the well trenches 15a, 15b. In this embodiment, the dielectric fill material is first deposited within the well trenches 15a, 15b, and is then recessed so that the recessed portion of the dielectric fill material, hereafter referred to as dielectric fill 25, is only present in the lower half of the well trenches 15a, 15b. The dielectric compositions described above for the well region spacers 20 are equally suitable for the dielectric fill 25. The dielectric fill 25 may be deposited using APCVD, LPCVD, PECVD, MOCVD, spinning from solution, spraying from solution, evaporation and combinations thereof. In one example, the dielectric fill 25 is formed using a non-conformal deposition process, such as high density plasma chemical vapor deposition. The etch process employed to recess the dielectric fill 25 may be an anisotropic etch, such as reactive ion etch, ion beam etching, or laser ablation. The upper surface of the dielectric fill 25 may be present in the lower half of the well trenches 15a, 15b. In another embodiment, the upper surface of the dielectric fill 25 may be present in the lower quarter of the well trenches 15a, 15b. In one embodiment, the thickness T1 of the dielectric fill 25 ranges from 1 nm to 200 nm. In another embodiment, the thickness T1 of the dielectric fill 25 ranges from 5 nm to 60 nm.

In another embodiment, the dielectric fill 25 may be composed of a stress inducing material. The term "stress inducing material" denotes a material having an intrinsic stress, in which the intrinsic stress effectuates a stress the channel of the semiconductor device. As used herein, the term "channel" is the region underlying the functional gate structure and between the source and drain of a semiconductor device that becomes conductive when the semiconductor device is turned on. The channel of the semiconductor device is present in the remaining portions of the SOI layer 4a, 4b, 4c. The stress inducing material may be a compressive stress inducing material or a tensile stress inducing material. The term "compressive stress inducing material" denotes a material having an intrinsic compressive stress, in which the intrinsic compressive stress produces a compressive stress in the channel of the semiconductor device. The term "tensile stress inducing material" denotes a material layer having an intrinsic tensile stress, in which the intrinsic tensile stress produces a tensile stress in the channel of the semiconductor device. In one embodiment, the dielectric fill 25 is a tensile stress inducing material when the semiconductor device being formed is an n-type semiconductor device, such as an n-type field effect transistor (nFET), and the dielectric fill 25 is a compressive stress inducing material when the semiconductor device being formed is a p-type semiconductor device, such as a p-type field effect transistor (pFET). Compressive strain within the channel increases the speed of hole charge carriers, and therefore provides performance enhancements, such as increased switching speed, in p-type semiconductor devices.

Plasma enhanced chemical vapor deposition (PECVD) can form a dielectric fill 25 having a compressive or tensile internal stress, i.e., intrinsic stress. The stress state of the stressed dielectric layer deposited by PECVD can be controlled by changing the deposition conditions to alter the reaction rate within the deposition chamber. More specifically, the stress state of the dielectric fill 25 may be set by changing the deposition conditions such as: $SiH_4/N_2$/He gas flow rate, pressure, RF power, and electrode gap. In one embodiment, a dielectric fill 25 composed of tensile stress inducing material may be formed by plasma enhanced chemical vapor deposition (PECVD) of silicon nitride, in which the deposition conditions include a low frequency power ranging up to 100 W, a high frequency power ranging from 200 W to 600 W, a silane flow rate ranging from 50 sccm to 200 sccm, an $NH_3$ flow rate ranging from 1,500 sccm to 3,000 sccm, and a deposition pressure of 15 Torr or less. In one embodiment, a dielectric fill 25 composed of compressive stress inducing material may be formed by plasma enhanced chemical vapor deposition (PECVD) of silicon nitride, in which the deposition conditions include a low frequency power ranging from 500 W to 1,500 W, a high frequency power ranging from 250 W to 500 W, a silane flow rate ranging from 800 sccm to 2,000 sccm, an $NH_3$ flow rate ranging from 6,000 to 10,000 sccm, and a deposition pressure of 10 Torr or less.

In one example, the compressive stress that is induced on the channel of the semiconductor device by the dielectric fill 25 composed of compressive stress inducing material may have a magnitude ranging from 100 MPa to 1000 MPa. In another example, the compressive stress on the channel induced by the compressive stress inducing material has a magnitude ranging from 300 MPa to 400 MPa. In one example, the tensile stress that is induced on the channel of the semiconductor device by the dielectric fill 25 composed of tensile stress inducing material may have a magnitude ranging from 100 MPa to 1000 MPa. In another example, tensile strain on the channel may have a magnitude ranging from 300 MPa to about 400 MPa.

Figure 4A:
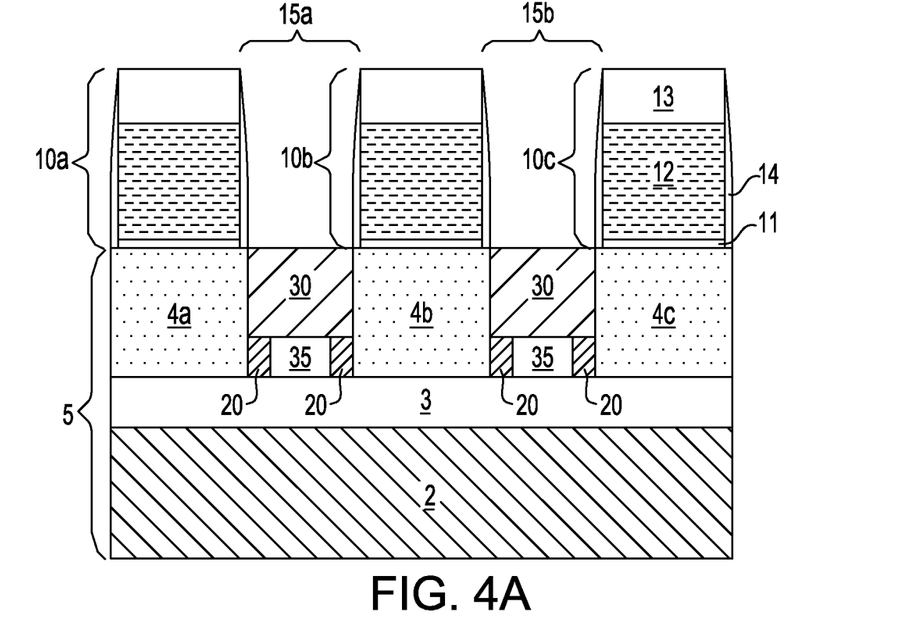
FIG. 4A is a side cross-sectional view depicting forming a source region and a drain region in the well trenches depicted in FIG. 3A with an in-situ doped epitaxial semiconductor material, in accordance with one embodiment of the present disclosure.

FIG. 4A depicts forming a source region and a drain region in the well trenches 15a, 15b that are depicted in FIG. 3A. The source and drain regions may be provided by an in-situ doped epitaxial semiconductor material 30 that is grown within the well trenches 15a, 15b. The terms "epitaxial", "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Thus, an epitaxial film deposited on a {100} crystal surface will take on a {100} orientation. The fact that the process is selective means that the deposited semiconductor material grows only on exposed semiconductor regions and does not grow on a dielectric, such as the buried dielectric layer 3.

In some embodiments, the deposition surface for epitaxial growth of the semiconductor material that provides the in-situ doped epitaxial semiconductor material 30 for the source and drain regions is the exposed sidewall surface of the remaining portions of the SOI layer 4a, 4b 4c that are underlying the replacement gate structures 10a, 10b, 10c, which contains the channel of the semiconductor devices being formed. Therefore, the epitaxially formed semiconductor material that provides the source and drain regions may have the same crystalline structure as the remaining portions of the SOI layer 4a, 4b, 4c that contains the channel of the semiconductor device. For example, in some embodiments, when the remaining portions of the SOI layer 4a, 4b, 4c is composed of a single crystal material, the epitaxial semiconductor material of the in-situ doped epitaxial semiconductor material that provides the source and drain regions will also be composed of a single crystal material. In some embodiments, epitaxial growth of the semiconductor material for the source and drain regions from the sidewalls of the remaining portions of the SOI layer 4a, 4b, 4c may be referred to as lateral epitaxial growth.

In one embodiment, the in-situ doped epitaxial semiconductor material 30 may be composed of silicon-containing material. A number of different sources may be used for the deposition of epitaxial silicon. In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6 Si_2$) and combinations thereof. The temperature for epitaxial silicon deposition typically ranges from 250° C. to 900° C.

In another embodiment, the in-situ doped epitaxial semiconductor material 30 may be composed of germanium (Ge). A number of different sources may be used for the deposition of epitaxial germanium. In some embodiments, the germanium containing gas sources for epitaxial growth include germane ($GeH_4$), digermane ($Ge_2H_6$), halogermane, dichlorogermane, trichlorogermane, tetrachlorogermane and combinations thereof.

In yet another embodiment, the in-situ doped epitaxial semiconductor material 30 is composed of a germanium-containing material, such as silicon germanium (SiGe). A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 40%.

In an even further embodiment, the in-situ doped epitaxial semiconductor material 30 is composed of silicon doped with carbon (Si:C). The carbon (C) content of the epitaxial grown silicon doped with carbon may range from 0.3% to 5%, by atomic weight %. In another embodiment, the carbon content of the epitaxial grown silicon doped with carbon may range from 1% to 2%.

Referring to FIG. 3A, in some embodiments, epitaxial growth of the semiconductor material for the in-situ doped epitaxial semiconductor material 30 is continued until the upper surface of the semiconductor material is substantially coplanar with the upper surface of the remaining portions of the SOI layer 4a, 4b, 4c. In some embodiments, the semiconductor material that is epitaxially grown for the in-situ doped epitaxial semiconductor material 30 does not contact the buried dielectric layer 3. In some embodiments, a void is present between the in-situ doped epitaxial semiconductor material 30, the buried dielectric layer 3 and the well region spacers 20. The presence of the void and the well region spacers 20 separates the in-situ doped epitaxial semiconductor material 30 from the buried dielectric layer 3, which can reduce leakage in the final semiconductor device.

Still referring to FIG. 3A, the in-situ doped epitaxial semiconductor material 30 typically includes a dopant that dictates the conductivity type of the source and drain regions, which is introduced by in-situ means. By "in-situ" it is meant that the dopant that dictates the conductivity type of the source and drain regions is introduced during the process step, e.g., epitaxial deposition, that forms the in-situ doped epitaxial semiconductor material 30. The conductivity type of the source region and the drain region typically dictates the conductivity type of the semiconductor device. The in-situ doped epitaxial semiconductor material 30 may include either an n-type or p-type dopant. As used herein, "p-type" refers to the addition of impurities to an intrinsic semiconductor that creates deficiencies of valence electrons. In a silicon-containing semiconductor material or other type IV semiconductor material (semiconductor material from type IV of the Periodic Table of Elements), examples of p-type dopants, i.e., impurities, include but are not limited to, boron, aluminum, gallium and indium. As used herein, "n-type" refers to the addition of impurities that contributes free electrons to an intrinsic semiconductor. In a silicon containing semiconductor material or other type IV semiconductor material, examples of n-type dopants, i.e., impurities, include but are not limited to antimony, arsenic and phosphorous. By doping the source and drain regions using an in-situ doping method in combination with epitaxial growth, the methods disclosed herein reduce lateral straggle of the source and drain dopants that is typical of high energy ion implantation.

In some embodiments, the dopant concentration of the n-type or p-type dopant region in the in-situ doped epitaxial semiconductor material 30 ranges from $5\times10^{19}$ atoms/cm$^3$ to $5\times10^{20}$ atoms/cm$^3$. In another embodiment, the dopant concentration of the n-type or p-type dopant region in the in-situ doped epitaxial semiconductor material 30 ranges from $7\times10^{19}$ atoms/cm$^3$ to $2\times10^{20}$ atoms/cm$^3$. The channel that is present within the remaining portions of the SOI layer 4a, 4b, 4c may be substantially free of the p-type or n-type dopant, but may also have a p-type or n-type dopant concentration that ranges from $10^{16}$ atoms/cm$^3$ to the $10^{18}$ atoms/cm$^3$), which is present in the in-situ doped epitaxial semiconductor material 30. The doped width of portions 4a, 4b and 4c, i.e., the electrical junction that is specifically close to the buried dielectric layer 3, remains and is not drastically decreased by the doping of the source drain regions. In some embodiments, the source and drain regions are activated by a high temperature anneal, while the replacement gate structures 10a, 10b, 10c are present on the SOI substrate 5.

Figure 4B:
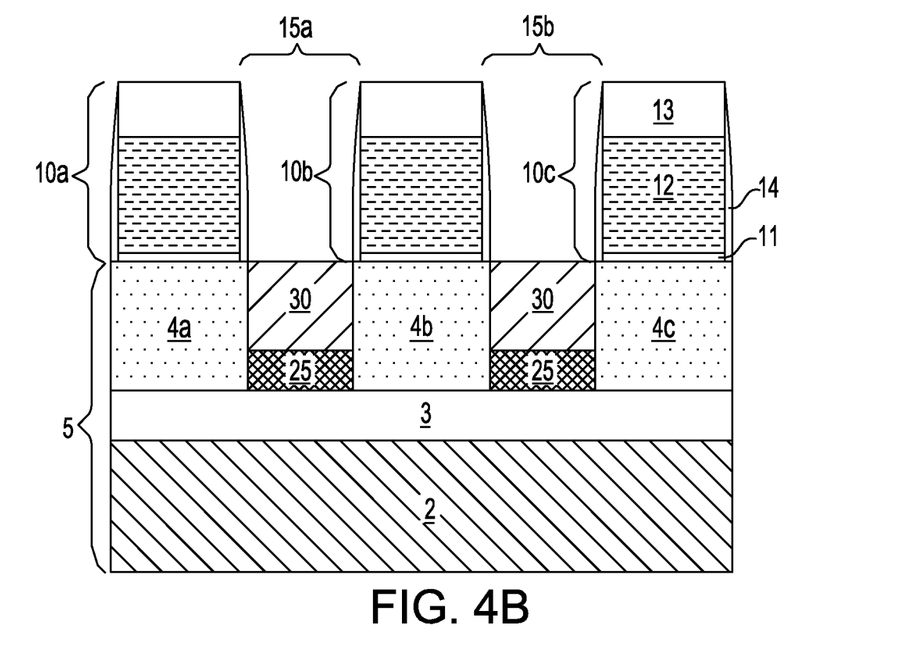
FIG. 4B is a side cross-sectional view depicting forming a source region and a drain region in the well trenches depicted in FIG. 3*b* with an in-situ doped epitaxial semiconductor material, in accordance with one embodiment of the present disclosure.

FIG. 4B depicts one embodiment of forming a source region and a drain region in the well trenches 15a, 15b depicted in FIG. 3B with an in-situ doped epitaxial semiconductor material 30. The in-situ doped epitaxial semiconductor material 30 that is depicted in FIG. 4B is similar to the in-situ doped epitaxial semiconductor material 30 that is depicted in FIG. 4A. Therefore, the above description of the in-situ doped epitaxial semiconductor material 30 that is depicted in FIG. 4A is suitable for the in-situ doped epitaxial semiconductor material 30 that is depicted in FIG. 4B. In one embodiment, the in-situ doped epitaxial semiconductor material 30 that is depicted in FIG. 4B is in direct contact with the entire upper surface of the dielectric fill 25, wherein the dielectric fill 25 is separating the in-situ doped epitaxial semiconductor material 30 from the buried dielectric layer 3.

Figure 5:
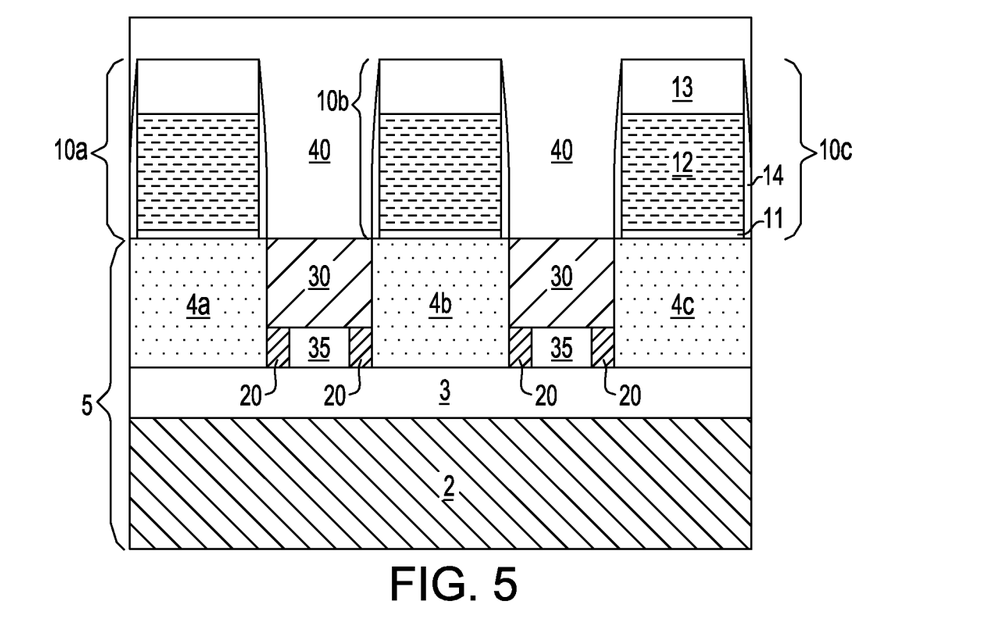
FIG. 5 is a side cross-sectional view depicting forming an intralevel dielectric layer on the structure depicted in FIG. 4A, in accordance with one embodiment of the present disclosure.

FIG. 5 depicts one embodiment of forming an intralevel dielectric layer 40 on the structure depicted in FIG. 4A. The intralevel dielectric layer 40 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, $\alpha$-C:H). Additional choices for the intralevel dielectric layer 40 include any of the aforementioned materials in porous form, or in a form that changes during processing to or from being porous and/or permeable to being non-porous and/or non-permeable. The intralevel dielectric layer 40 may be deposited using at least one of spinning from solution, spraying from solution, chemical vapor deposition (CVD), plasma enhanced CVD (PECVD), ion-beam deposition, and evaporation. Although not depicted in the supplied figures, the intralevel dielectric layer 40 may also be deposited on the structure depicted in FIG. 4B.

FIG. 6 depicts one embodiment of removing the replacement gate structures 10a, 10b, 10c from the structure depicted in FIG. 5 to expose the remaining portions of the SOI layer 4a, 4b, 4c that contain the channel, and forming a functional gate structure 45a, 45b, 45c on the remaining portions of the SOI layer 4a, 4b, 4c that contain the channel. The term "functional gate structure" means a structure used to control output current (i.e., flow of carriers in the channel) of a semiconducting device through electrical or magnetic fields. Removing the replacement gate structures 10a, 10b, 10c may begin with applying a planarization process to the intralevel dielectric layer 40 to expose an upper surface of the replacement gate structures 10a, 10b, 10c, wherein the upper surface of the intralevel dielectric layer 40 is coplanar with the upper surface of the replacement gate structures 10a, 10b, 10c. The planarization of the intralevel dielectric layer 40 may be provided by chemical mechanical planarization (CMP). Once the upper surface of the replacement gate structures 10a, 10b, 10c are exposed, the replacement gate structures 10a, 10b, 10c may be removed by a selective etch process.

The replacement gate structures 10a, 10b, 10c may be removed using a wet or dry etch process. In one embodiment, the replacement gate structures 10a, 10b, 10c are removed by reactive ion etch (RIE). In one example, an etch step for removing the replacement gate structures 10a, 10b, 10c can include an etch chemistry for removing the replacement gate structures 10a, 10b, 10c selectively to the remaining portions of the SOI layer 4a, 4b, 4c of the SOI substrate 5. It is noted that the etch process for removing the replacement gate structures 10a, 10b, 10c may include multiple stages with different etch chemistries to selectively remove the different elements of the replacement gate structures 10a, 10b, 10c. For example, and in one embodiment, a first etch chemistry may be employed to remove the sacrificial gate cap 13 selectively to the sacrificial gate electrode 12, a second etch chemistry may be employed to remove the sacrificial gate electrode 12 selectively to the sacrificial gate dielectric 11, and a third etch chemistry may be employed to remove the sacrificial gate dielectric 11 selectively to the remaining portions of the SOI layer 4a, 4b, 4c. Some examples of etch chemistries that are suitable for removing the replacement gate structures 10a, 10b, 10c include $SF_6$, $NH_4OH$ and HBr.

FIG. 6 further depicts forming functional gate structures 45a, 45b, 45c on the channel portion of the remaining portions of the SOI layer 4a, 4b, 4c that are exposed by removing the replacement gate structures. The at least one gate dielectric 46 of the functional gate structures 45a, 45b, 45c may be composed of any dielectric material including oxides, nitrides and oxynitrides. In one embodiment, the at least one gate dielectric 46 may be provided by a high-k dielectric material. The term "high-k" as used to describe the material of the at least one gate dielectric 46 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In an even further example, the dielectric constant of the high-k dielectric material may be greater than 10.0. In one embodiment, the at least one gate dielectric 46 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 46 include hafnium silicate, hafnium silicon oxynitride or combinations thereof.

In one embodiment, the at least one gate dielectric 46 may be deposited by chemical vapor deposition (CVD). Variations of CVD processes suitable for depositing the at least one gate dielectric 46 include, but are not limited to, APCVD, LPCVD, PECVD, MOCVD and combinations thereof. In one embodiment, the at least one gate dielectric 46 may be deposited using a conformal deposition method. In one embodiment, the thickness of the at least one gate dielectric 46 is greater than 0.8 nm. More typically, the at least one gate dielectric 46 has a thickness ranging from about 1.0 nm to about 6.0 nm.

In a following process step, the at least one gate conductor 47 is formed on the at least one gate dielectric 46. The at least one gate conductor 47 may be formed by a deposition process, such as CVD, plasma-assisted CVD, plating, and/or sputtering, followed by planarization. In one embodiment, the at least one gate conductor 47 is composed of metal or a doped semiconductor. Examples of metals that may be employed for the at least one gate conductor 47 may include, but is not limited to, W, Ni, Ti, Mo, Ta, Cu, Pt, Ag, Au, Ru, Ir, Rh, and Re, and alloys thereof. One example of a doped semiconductor that is suitable for the at least one gate conductor 47 is doped polysilicon.

FIG. 6 is a process step of a gate last process sequence. As indicated above, the methods and structures of the present disclosure are equally applicable in a gate first process. In the gate first process, the functional gate structure is formed prior to the well trenches 15a, 15b, and remains in the final structure of the semiconductor device. In one example, a gate first process may use the procedures for forming the replacement gate structure 10a, 10b, 10c described in FIG. 1 in combination with replacing the sacrificial gate dielectric 11 and the sacrificial gate electrode 12 with the at least one gate dielectric 46 and the at least one gate electrode 47 that are described with reference to FIG. 6 to provide a functional gate structure before forming the well trenches 15a, 15b that are depicted in FIG. 2. The functional gate structure of the gate first process is not removed, and therefore remains in the structure during the steps of forming the well region spacers 20 or dielectric fill 25 depicted FIGS. 3A and 3B, forming the in-situ doped semiconductor material 30 depicted in FIG. 4, and forming the intralevel dielectric 40 that is depicted in FIG. 5.

Figure 7A:
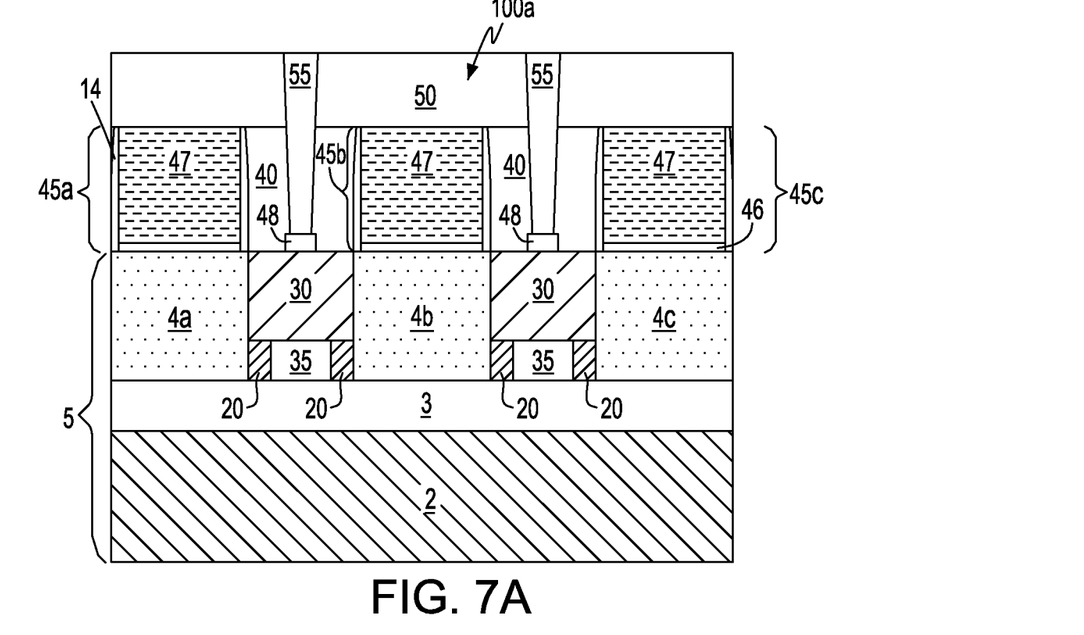
FIG. 7A is a side cross-sectional view depicting forming interconnects to the source and drain regions of the structure depicted in FIG. 6, in accordance with one embodiment of the present disclosure.

FIG. 7A depicts forming interconnects 55 to the in-situ doped semiconductor material 30 that provides the source and drain regions of the structure depicted in FIG. 6. In some embodiments, forming the interconnects 55 may begin with depositing an interlevel dielectric layer 50 over the structure depicted in FIG. 6. The interlevel dielectric layer 50 may be composed of the same or a similar material as the intralevel dielectric layer 40. Therefore, the description for the composition of the intralevel dielectric layer 40 that is described with reference to FIG. 5 is suitable for the interlevel dielectric layer 50 that is depicted in FIG. 7A.

The interlevel dielectric layer 50 may be formed by various methods well known to those skilled in the art, including, but not limited to, spinning from solution, spraying from solution, chemical vapor deposition (CVD), plasma enhanced CVD (PECVD), sputter deposition, reactive sputter deposition, ion-beam deposition, and evaporation. The deposited interlevel dielectric layer 50 is then patterned and etched to forth via holes to the in-situ doped semiconductor material 30. Metal semiconductor alloy regions 48 may then be formed on the surface of the in-situ doped semiconductor material 30 exposed by the via holes. Formation of the metal semiconductor alloy regions 48 typically requires depositing a refractory metal, such as Ni or Ti, onto the surface of the in-situ doped semiconductor material 30. Following deposition, the structure is then subjected to an annealing step using conventional processes such as, but not limited to, rapid thermal annealing. During thermal annealing, the deposited metal reacts with the in-situ doped semiconductor material forming a metal semiconductor alloy. In one embodiment, the metal semiconductor alloy 48 is a silicide. Following via formation, interconnects 55 are formed within the via holes in contact with the metal semiconductor alloy 48 by depositing a conductive metal into the via holes using a physical vapor deposition (PVD) process, such as CVD or plating. The conductive metal may include, but is not limited to: tungsten, copper, aluminum, silver, gold, and alloys thereof.

FIG. 7A depicts one embodiment of a semiconductor device 100a that includes semiconductor on insulator (SOI) substrate 5 including a semiconductor on insulator (SOI) layer 4b that is present on a buried dielectric layer 3, and a functional gate structure 45b that is present on a channel portion of the SOI layer 4b. Well regions comprised of an epitaxial semiconductor material (also referred to as "in-situ doped epitaxial semiconductor material 30") are in direct contact with opposing sides of the channel portion of SOI layer 4b and provide a source region and a drain region of the semiconductor device 100a. Still referring to FIG. 7A, a well region spacer 20 is positioned between the buried dielectric layer 3, the channel portion of the SOI layer 4b and the epitaxial semiconductor material 30. The well region spacer 20 has a base surface in direct contact with a surface of the buried dielectric layer 3 and a sidewall surface that is in direct contact with a sidewall of the channel portion of the SOI layer 4b.

Figure 7B:
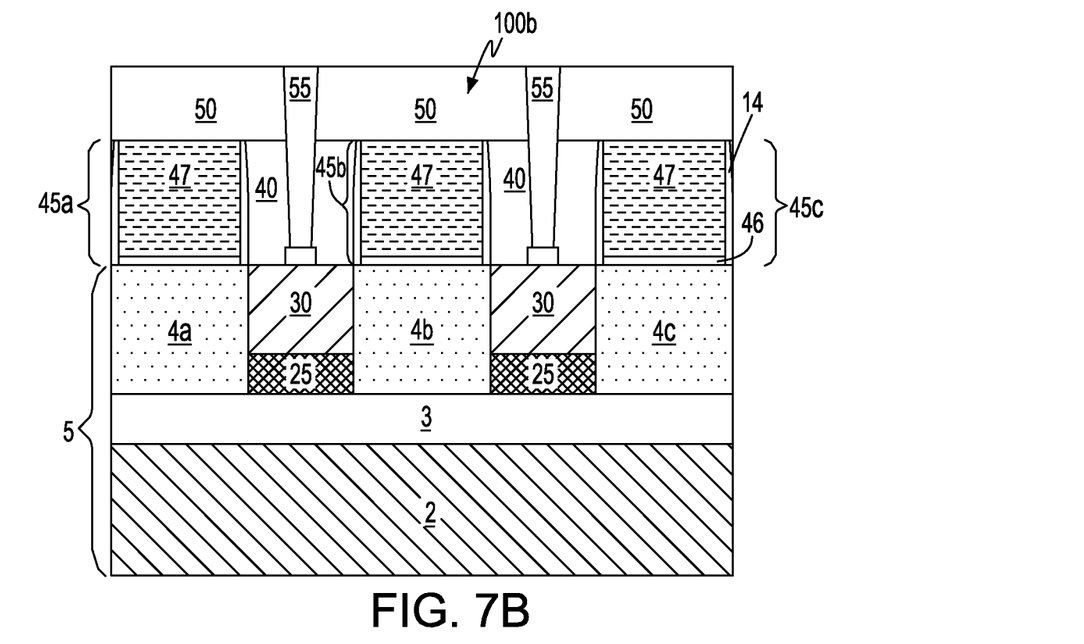
FIG. 7B is a side cross-sectional view that depicts forming interconnect to source and drain regions of an in-situ doped semiconductor material that are present over a dielectric fill material as depicted in FIG. 4B, in accordance with one embodiment of the present disclosure.

FIG. 7B depicts forming interconnects 55 to the source and drain regions of an in-situ doped semiconductor material 30 that are present over a dielectric fill 25, as depicted in FIG. 4B. The process sequence for forming the interconnects 55 depicted in FIG. 7B has been described above with reference to FIG. 7A. FIG. 7B depicts a semiconductor device 100b including an SOI substrate 5 including an SOI layer 4 that is present on a buried dielectric layer 3. A functional gate structure 45b is present on a channel portion of the SOI layer 4b. Well regions of an epitaxial semiconductor material (also referred to as "in-situ doped epitaxial semiconductor material 30") are in direct contact with opposing sides of the channel portion of SOI layer 4b and have a same crystal structure as the channel portion of the SOI layer 4b. A dielectric fill 25 is present between the well region of the epitaxial semiconductor material and the buried dielectric layer 3.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
    forming well trenches on opposing sides of a gate structure by removing portions of a semiconductor on insulator (SOI) layer of an semiconductor on insulator (SOI) substrate, wherein the base of the well trenches is provided by a surface of a buried dielectric layer of the SOI substrate and sidewalls of the well trenches are provided by a remaining portion of the SOI layer;
    forming a dielectric fill material at the base of the well trenches, wherein the dielectric fill material is in contact with the sidewalls of the well trenches and at least a portion of the surface of the buried dielectric layer that provides the base of the well trenches; and
    forming a source region and a drain region in the well trenches with an in-situ doped epitaxial semiconductor material.

2. The method of claim 1, wherein the gate structure is a replacement gate structure that is formed on the SOI substrate before said forming of the well trenches, and the method of forming the semiconductor device further comprises:
    removing the replacement gate structure after forming the source region and the drain region in the well trenches to expose a channel portion of the remaining portion of the SOI layer; and
    forming a functional gate structure on the channel portion of the remaining portion of the SOI layer.

3. The method of claim 2, wherein forming the replacement gate structure comprises:
    forming a sacrificial gate dielectric layer on the SOI substrate;
    forming a sacrificial semiconductor material layer on the sacrificial gate dielectric layer;
    forming a dielectric cap layer on the sacrificial semiconductor material layer;
    forming a first etch mask on a material stack including the sacrificial gate dielectric layer, the sacrificial semiconductor material layer, and the dielectric cap layer; and
    etching the material stack selectively to the SOI layer of the SOI substrate and the first etch mask to provide the replacement gate structure.

4. The method of claim 2, wherein the removing of the replacement gate structure to expose a channel portion of the remaining portion of the SOI layer comprises:

forming an interlevel dielectric layer covering the replacement gate structure and the source region and the drain region;

planarizing the interlevel dielectric layer to expose an upper surface of the replacement gate structure; and removing the replacement gate structure with an etch that is selective to the interlevel dielectric layer.

5. The method of claim 4, wherein the forming of the functional gate structure on the channel portion of the remaining portion of the SOI layer comprises depositing a gate dielectric layer on the channel portion, and depositing a metal gate conductor on the gate dielectric layer.

6. The method of claim 1 further comprising forming a gate sidewall spacer adjacent to the sidewall of the gate structure.

7. The method of claim 1, wherein the forming of the well trenches on opposing sides of the gate structure by removing portions of the SOI layer comprises anisotropically etching portions of the SOI layer adjacent to the replacement gate structure with an etch chemistry that is selective to the buried dielectric layer and the replacement gate structure.

8. The method of claim 1, wherein the forming of the dielectric fill material at the base of the well regions comprises forming well spacers, wherein the well spacers are in direct contact with a lower portion of the sidewalls of the well regions, and an exposed portion of the buried dielectric layer is present between covered portions of the surface of the buried dielectric layer that provides the base of the well regions.

9. The method of claim 8, wherein the well spacers are provided by depositing a well spacer material at the base of the well trenches, and etching the well spacer material to remove a central portion of the well spacer material to provide the exposed portion of the buried dielectric layer that is present between the covered portions of the surface of the buried dielectric layer.

10. The method of claim 1, wherein the forming of the dielectric fill material at the base of the well trenches comprises depositing a dielectric material covering an entirety of the surface of the buried dielectric layer that provides the base of the well trenches.

11. The method of claim 10, wherein the dielectric material covering the entirety of the surface of the buried dielectric layer is a tensile strain inducing material or a compressive strain inducing material.

12. The method of claim 1, wherein the forming of the source region and the drain region in the well trenches with the in-situ doped epitaxial semiconductor material comprises depositing the in-situ doped epitaxial semiconductor material from a gas source selected from the group consisting of silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6 Si_2$), germane ($GeH_4$), digermane ($Ge_2H_6$), halogermane, dichlorogermane, trichlorogermane, tetrachlorogermane and combinations thereof.

13. The method of claim 1, wherein the in-situ doped epitaxial semiconductor material is doped with an n-type or p-type conductivity dopant.

\* \* \* \* \*